United States Patent
Dorfner et al.

(10) Patent No.: US 12,526,990 B2
(45) Date of Patent: Jan. 13, 2026

(54) METAL HARDMASKS

(71) Applicant: Tokyo Electron Limited, Tokyo (JP)

(72) Inventors: Alec Dorfner, Fort Ann, NY (US); Minjoon Park, Watervliet, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 722 days.

(21) Appl. No.: 17/831,695

(22) Filed: Jun. 3, 2022

(65) Prior Publication Data

US 2023/0397416 A1   Dec. 7, 2023

(51) Int. Cl.

| | |
|---|---|
| *H01L 27/11524* | (2017.01) |
| *H01L 21/311* | (2006.01) |
| *H10B 12/00* | (2023.01) |
| *H10B 41/35* | (2023.01) |
| *H10B 43/35* | (2023.01) |
| *H10B 99/00* | (2023.01) |
| *H10D 88/00* | (2025.01) |

(52) U.S. Cl.
CPC ........ *H10B 41/35* (2023.02); *H01L 21/31144* (2013.01); *H10B 12/20* (2023.02); *H10B 43/35* (2023.02); *H10B 99/00* (2023.02); *H10D 88/00* (2025.01)

(58) Field of Classification Search
None
See application file for complete search history.

(56) References Cited

U.S. PATENT DOCUMENTS

| | | | | |
|---|---|---|---|---|
| 5,386,962 | A * | 2/1995 | Adriance | F16F 15/067 248/638 |
| 7,977,390 | B2 * | 7/2011 | Ji | H01L 21/0337 438/723 |
| 8,383,508 | B2 * | 2/2013 | Liu | H01L 21/31144 438/618 |
| 9,184,060 | B1 | 11/2015 | Lee | |
| 9,620,377 | B2 | 4/2017 | Hudson et al. | |
| 10,431,458 | B2 | 10/2019 | Hudson et al. | |
| 2005/0142734 | A1 * | 6/2005 | Shin | H01L 21/76224 257/E21.546 |
| 2007/0249171 | A1 | 10/2007 | Sung | |
| 2008/0102640 | A1 | 5/2008 | Hassan et al. | |
| 2011/0287633 | A1 | 11/2011 | Lee | |
| 2015/0087154 | A1 | 3/2015 | Guha | |

FOREIGN PATENT DOCUMENTS

| | | | |
|---|---|---|---|
| CN | 110957268 | * | 4/2020 |
| JP | 5386962 B2 | * | 1/2014 |
| KR | 20130023806 A | | 3/2013 |

OTHER PUBLICATIONS

International Search Report and Written Opinion, PCT Application No. PCT/US2023/023898, mailed Sep. 21, 2023, 10 pages.

* cited by examiner

Primary Examiner — Long Pham
(74) Attorney, Agent, or Firm — Slater Matsil, LLP

(57) ABSTRACT

A method for forming a semiconductor device includes forming a first metal layer on top of an amorphous mask layer disposed over a substrate, forming a second metal layer that covers vertical sidewalls of openings in the amorphous mask layer, and etching a pattern in the substrate using the first metal layer and the second metal layer as an etch mask.

20 Claims, 20 Drawing Sheets

METAL HARDMASKS

TECHNICAL FIELD

The present invention relates generally to hard masks for semiconductor processing and in particular to metal hard masks for manufacturing high aspect ratio geometries.

BACKGROUND

Semiconductor circuits continue to scale to smaller areas. To increase the number of transistors and other semiconductor devices per unit area, manufacturers are now utilizing the vertical dimension (3D). For example, in a 3D NAND memory array, charge trapping flash transistors are stacked vertically one on top of another on the sidewalls in high aspect ratio openings. In DRAM memory arrays, to increase capacitance, high aspect ratio DRAM trench capacitor openings are etched deeper and deeper into the semiconductor substrate. Through silicon vias (TSV) for stacking integrated circuit chips are fabricated by etching high aspect ratio holes completely through substrates.

Etch masks used to etch high aspect ratio openings such as trenches and holes need high mask to substrate etch selectivity to maintain pattern integrity throughout the extended high aspect ratio opening etches. Because etch selectivity of photoresist is inadequate, photoresist patterns are etched into hard masks and hard mask patterns are used as etch masks when etching high aspect ratio features.

SUMMARY

A method for forming a semiconductor device includes forming a first metal layer on top of an amorphous mask layer disposed over a substrate, forming a second metal layer that covers vertical sidewalls of openings in the amorphous mask layer, and etching a pattern in the substrate using the first metal layer and the second metal layer as an etch mask.

A method of processing a substrate includes: forming a low stress mask layer over the substrate; forming a first metal layer including a first metal over the low stress mask layer; forming openings in the first metal layer and the low stress mask layer; forming a metal spacer including a second metal on sidewalls of the openings, the first metal layer and the metal spacer defining a metal shell hard mask; and etching a high aspect ratio feature into the substrate using the metal shell hard mask as an etch mask.

A method of processing a substrate includes: forming a layer stack including a first metal layer and an amorphous mask layer on the substrate; forming an opening through the layer stack; covering sidewalls of the opening with a second metal layer, the first metal layer and the second metal layer defining a metal shell hard mask around the amorphous mask layer; performing an anisotropic etch process to extend the opening into the substrate, the metal shell hard mask being an etch mask during the anisotropic etch process; and removing the metal shell hard mask.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1A:
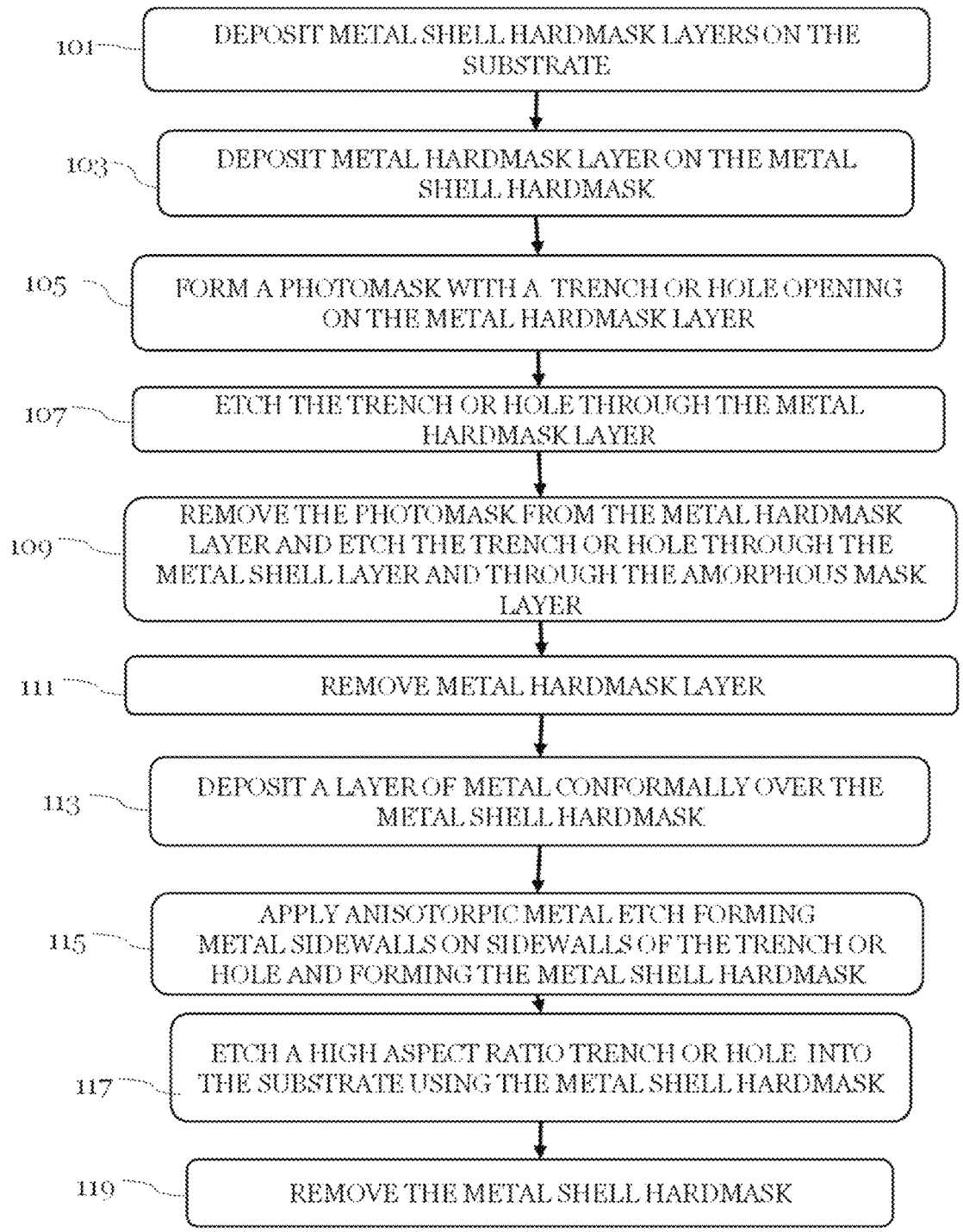
FIG. 1A is a flow diagram describing the formation of a metal shell hard mask and describing fabrication of a semiconductor device in accordance with embodiments.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

Hard masks utilized to etch high aspect ratio trenches and holes need to be relatively thick to permit only vertically directed atoms and ions from the etching gases to impinge upon the surface of the substrate. While hard masks made of a metal such as tungsten (W), titanium-tungsten (TiW), or titanium nitride (TiN) provide the required selectivity, stress from thick metal layers is excessive. Hard masks fabricated from thick low stress materials such as amorphous carbon and amorphous silicon provide acceptable stress, but selectivity is low when etching deep high aspect ratio trenches and holes. Because of the lower selectivity, very thick layers of amorphous materials have to be deposited, which may still not be sufficient to protect the underlying materials.

Gas mixtures such as Ar and O2 along with fluorinated hydrocarbons such as $C_4F_8$, $C_4F_6$, and $C_3F_8$ are generally used to etch high aspect ratio features in a dielectric such as silicon dioxide. Fluorinated hydrocarbons such as $CHF_3$, $CH_3F$, and CH2F2 are generally used to etch high aspect ratio features into dielectrics such as silicon nitride (SiN). Features such as openings having width to depth ratios greater than 20 are generally considered to be high aspect ratio features. Because the hard mask to substrate selectivity is low, higher carbon containing fluorocarbons may be added to the etching chemistry to improve selectivity between the mask material e.g., amorphous hard mask and material being etched. A higher carbon content fluorocarbon gas increases hard mask selectivity by increasing polymer deposition on the surface of the amorphous hard mask. Unfortunately, during etching of high aspect ratio features, polymer can also deposit on the sidewalls of these high aspect ratio features causing tapering of the sidewalls, which results in the bottom of the features being reduced in size and distorted. For example, the bottom critical dimension (CD) of the opening formed may be much smaller than the top CD of the opening.

Embodiments of this application disclose methods for forming metal shell hard masks for etching high aspect ratio geometries. These metal shell hard masks do not induce significant stress and provide high hard mask to substrate selectivity using low polymer forming fluorocarbon gases. Embodiment hard masks are formed by covering the surfaces of a low stress mask material with a thin metal shell. Embodiments of this application disclose methods of forming high aspect ratio trenches and holes in dielectric layers and in semiconductor substrates. Embodiments of this application disclose methods of forming high aspect ratio features including trenches and holes, for example, in memory cell arrays.

FIG. 1A is a flow diagram describing the formation of a metal shell hard mask and describing fabrication of a semiconductor device in accordance with embodiments. FIGS. 1B-1K are cross sectional views further describing some of the major steps in the flow diagram in FIG. 1A. For illustration, high aspect ratio openings are etched into a dielectric layer 108 on a semiconductor substrate 106. High aspect ratio openings can be rectangular, square, circular (as in contacts) or any other regular or irregular shape. High aspect ratio openings can be trenches or holes in various embodiments. In one embodiment, the semiconductor substrate 106 may be a single crystal semiconductor substrate such as a single crystal silicon wafer or a silicon-on-insulator substrate.

Figure 1B:
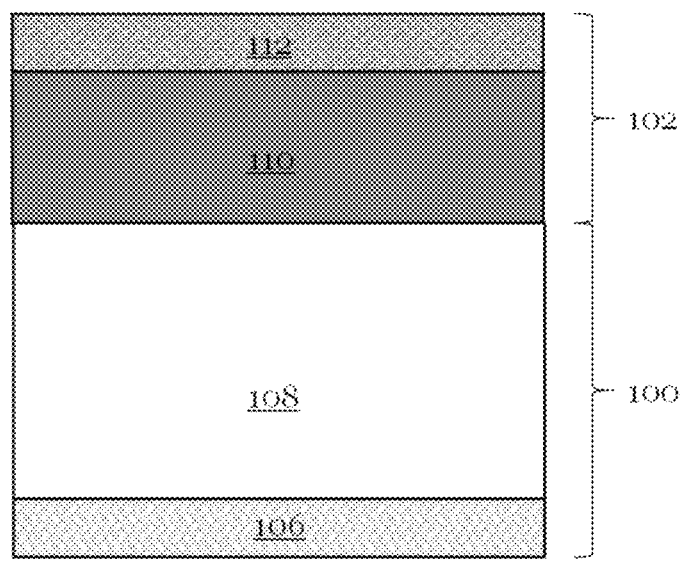
FIGS. 1B-1K are cross sectional views of a semiconductor device during various stages of fabrication and depicting steps in the flow diagram of FIG. 1A.

Referring to block 101 in FIG. 1A and to the cross-sectional view in FIG. 1B, metal shell hard mask layers 102 are deposited on the substrate 100. The substrate 100 may comprise a semiconductor substrate 106 such as a semiconductor wafer with an overlying dielectric layer 108. The metal shell hard mask layers 102 comprise a layer of amorphous mask layer no such as amorphous carbon or amorphous silicon covered with a thin first metal shell layer 112. In some embodiments, the amorphous mask layer no may be deposited using spin-on processes and may comprise spin-on carbon, for example. Amorphous mask layer no may in various embodiment be formed as a low stress mask material that have relatively low intrinsic stress due to the relaxation of the amorphous material. For example, the intrinsic stress of the low stress mask material, as measured, e.g., with wafer bow experiments, may be less than +/−20 MPa, and preferably close to zero. The first metal shell layer 112 may comprise a refractory metal such as tungsten, molybdenum, niobium, tantalum, titanium, chromium, hafnium, ruthenium, and zirconium including oxides, nitrides, oxynitrides of refractory metals. In one embodiment, the first metal shell layer 112 may comprise tungsten (W), tungsten nitride (WN), titanium tungsten (TiW), titanium (Ti), titanium nitride (TiN), tantalum (Ta), tantalum nitride (TaN), molybdenum as well as carbides such as tungsten carbide. In various embodiments, the first metal shell layer 112 may be deposited using various thin film deposition techniques such as physical vapor deposition, chemical vapor deposition, atomic layer deposition, as well as other techniques such as sputtering, evaporation and others.

The thickness of the amorphous mask layer no is determined by the depth of the high aspect ratio opening, e.g., trench or hole, to be etched into dielectric layer 108. The thickness of the first metal shell layer 112 can range from about 2 nm to 500 nm or more. Generally, the thickness of the first metal shell layer 112 may depend on the stress of the amorphous mask layer no and the dimensions of the opening being formed. For example, the thickness of the first metal shell layer 112 may be about 2 nm to 5 nm in one embodiment with high aspect ratio contact holes having small diameter, e.g., about 100 nm in diameter. The thickness of the first metal shell layer 112 may be about 150 nm to 350 nm in another embodiment with high aspect ratio contact holes having larger diameter, e.g., 1 to 5 microns in diameter.

Figure 1C:
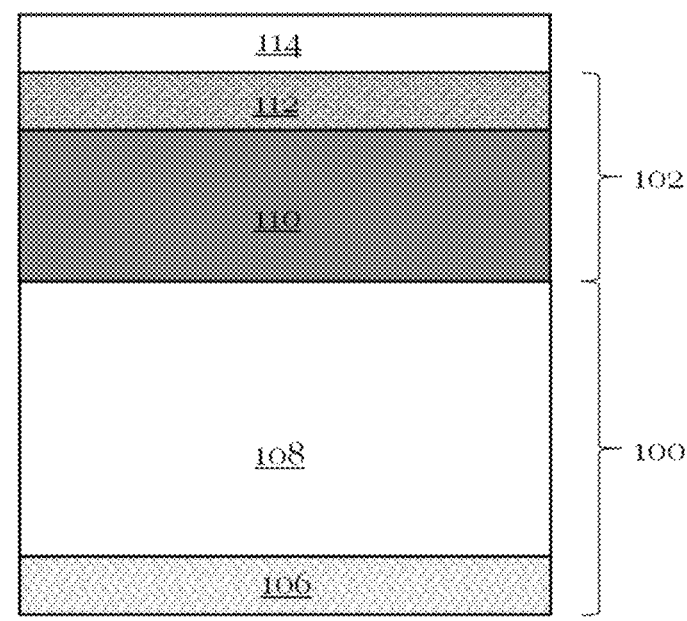

In block 103 of FIG. 1A and the cross-sectional view in FIG. 1C, a metal etch hard mask layer 114 is deposited on the first metal shell layer 112. Metal etch hard mask layer 114 is the hard mask layer primarily used as the etch mask while etching the first metal shell layer 112. Metal etch hard mask layer 114 can be a dielectric layer such as $SiO_2$, SiON, or SiN and deposited with known deposition techniques including vapor deposition techniques such as physical vapor deposition, chemical vapor deposition, plasma enhanced vapor deposition, and atomic layer deposition.

Figure 1D:
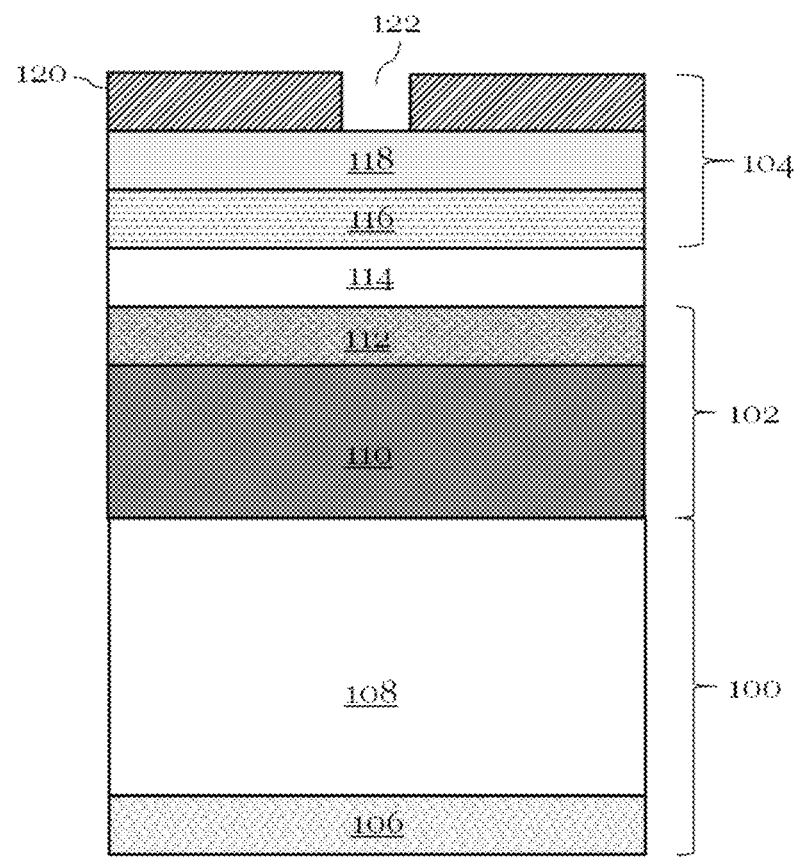

Referring to block 105 and the cross-sectional view in FIG. 1D, photomask layers 104 are deposited on the metal etch hard mask layer 114. Photomask layers 104 can be a trilayer photomask with a bottom organic (ODL) layer 116, a middle antireflective coat layer 118, and a top photoresist layer 120. A first opening 122 is formed in the photoresist layer 120 using conventional photolithography techniques.

Figure 1E:
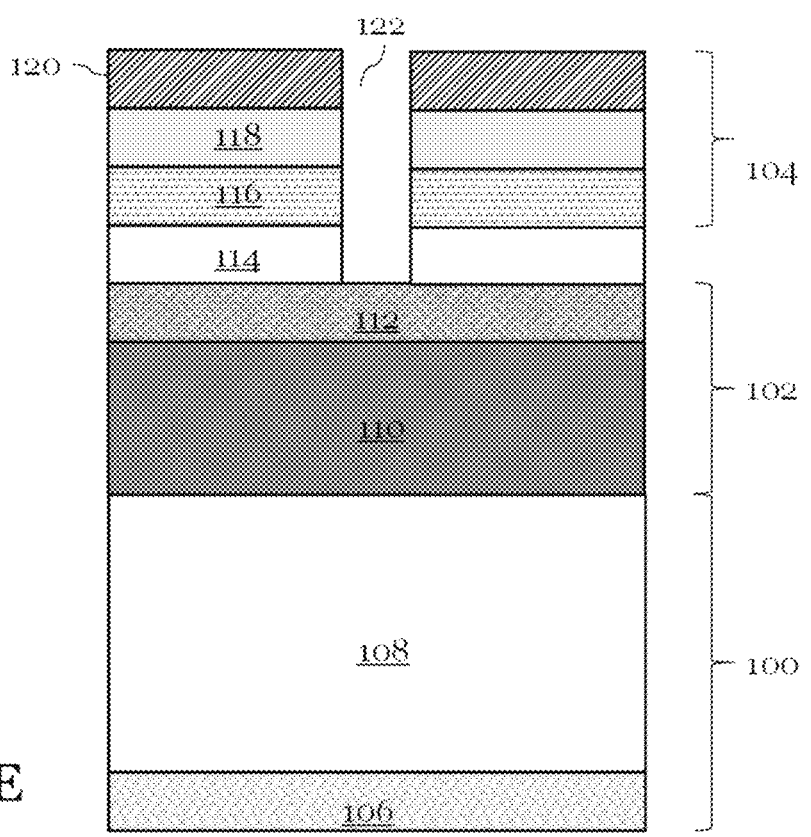

In block 107 and FIG. 1E, the first opening 122 is etched through the antireflective coat layer 118, through the bottom organic layer 116, and through the metal etch hard mask layer 114 stopping on the first metal shell layer 112. The first opening 122 may be etched using known anisotropic etching processes such as reactive ion etching.

Figure 1F:
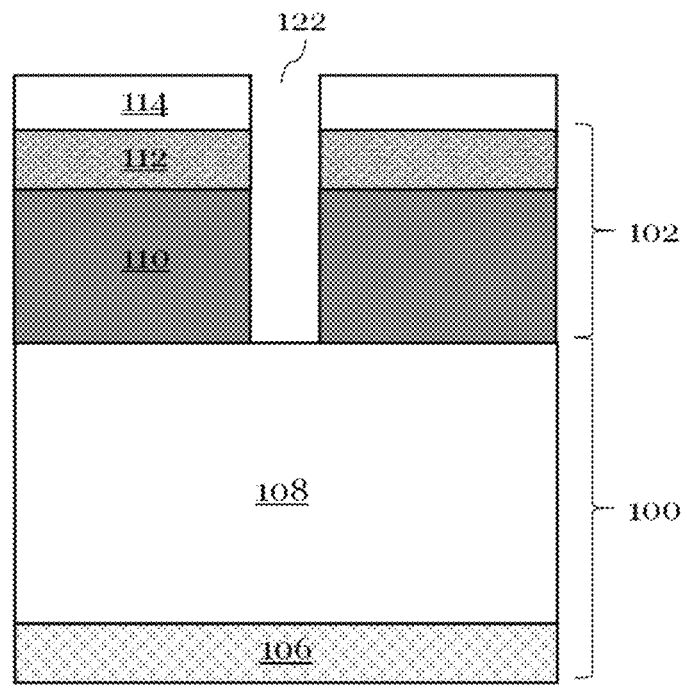
Figure 1G:
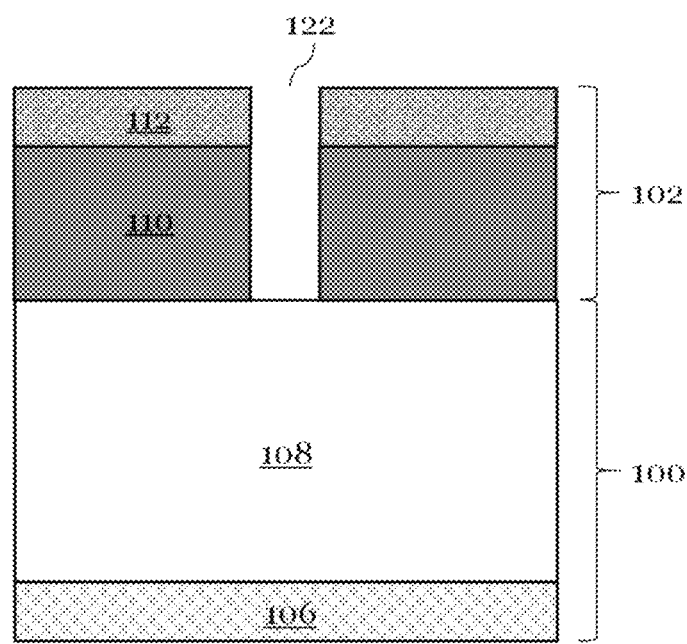

In block 109 and FIG. 1F, after the photomask layers 104 are removed from the metal etch hard mask layer 114, an anisotropic etch process using the metal etch hard mask layer 114 as etch mask, extends the first opening 122 through the metal shell hard mask layers 102 comprising the first metal shell layer 112 and the amorphous mask layer no. The first opening 122 stops on the dielectric layer 108.

The metal etch hard mask layer 114 can be removed using either a dry plasma etch or a wet etch. In the example described in block in and FIG. 1G, a wet etch with high selectivity may be used to remove the metal etch hard mask layer 114 relative to the dielectric layer 108. For example, when the dielectric layer 108 is $SiO_2$ and the metal etch hard mask layer 114 is SiN, hot phosphoric acid can be used to remove the SiN with no appreciable loss of the underlying $SiO_2$ layer.

Figure 1H:
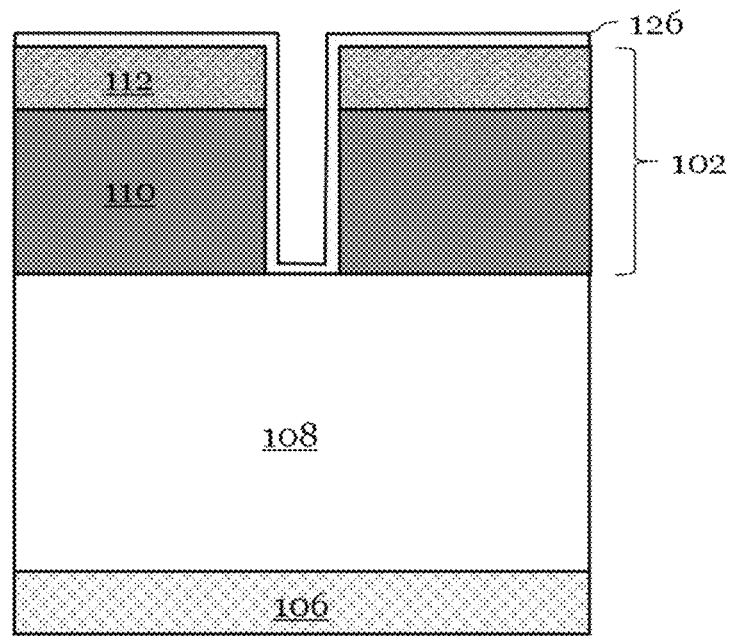

Referring now to block 113 and FIG. 1H, a second metal shell layer 126 is deposited conformally on the horizontal and vertical surfaces of the metal shell hard mask layers 102. The second metal shell layer 126 may comprise a refractory metal such as tungsten, molybdenum, niobium, tantalum, titanium, chromium, hafnium, ruthenium, and zirconium. In one embodiment, the second metal shell layer 126 can be a material such as tungsten (W), tungsten nitride (WN), titanium tungsten (TiW), titanium (Ti), titanium nitride (TiN), tantalum (Ta), or tantalum nitride (TaN), molybdenum as well as carbides such as tungsten carbide. In various embodiments, the second metal shell layer 126 may be deposited using various thin film deposition techniques such as physical vapor deposition, chemical vapor deposition, atomic layer deposition, as well as other techniques such as sputtering, evaporation, and others.

A thickness of the second metal shell layer can be about 2 nm or thicker, for example 1 nm to 10 nm in one embodiment.

Figure 1I:
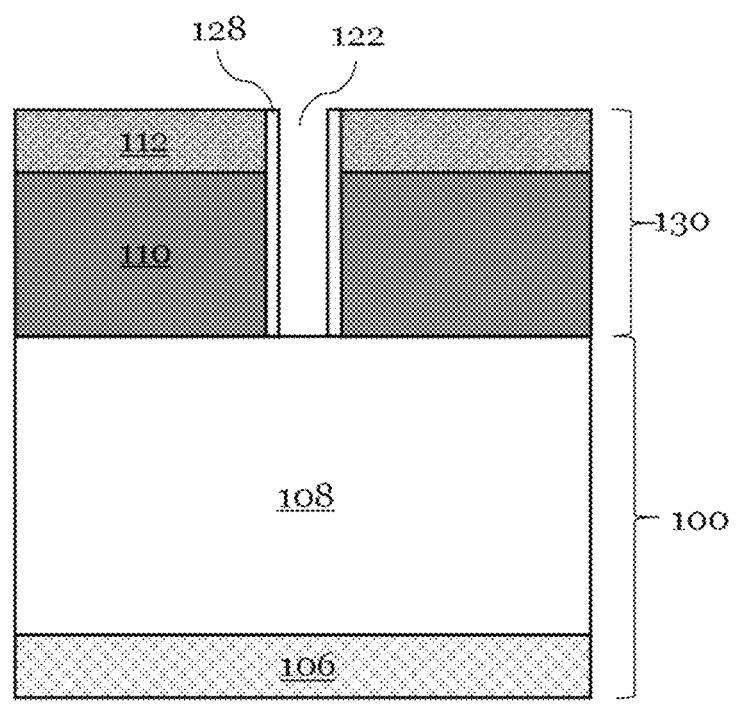

In block 115 and the cross-sectional view in FIG. 1I, an anisotropic etch removes the second metal shell layer 126 from horizontal surfaces, forming second metal shell sidewalls 128 in the first opening 122. In particular, the second metal shell layer 126 is removed from the top surface of the substrate 100 to expose the dielectric layer 108. In an anisotropic etch, bias is applied to accelerate ions in the etching gas plasma toward the substrate. The vertical trajectory of the ions causes horizontal surfaces to etch much faster than vertical surfaces.

In various embodiments, the second metal shell layer 126 can be the same material as the first metal shell layer 112 in some embodiments. Using the same metal shell material for the first metal shell layer 112 and second metal shell layer 126 may advantageously lower production cost by using the same metal deposition tool, which can reduce both cycle time and capital costs. In these embodiments, the anisotropic etch process must be carefully controlled to prevent complete removal of the first metal shell layer 112 from horizontal surfaces. In other embodiments, the first metal shell layer 112 material and the second metal shell layer 126 material can be different. These embodiments may increase equipment cost by requiring deposition of two different metals, but process control is relaxed. The anisotropic etch process window is significantly increased since the first metal shell layer 112 can be chosen to have high selectivity so as to be not removed while etching the second metal shell layer 126. This can ensure no part of the dielectric layer 108 is covered with any remaining second metal shell layer 126.

This completes fabrication of the metal shell hard mask 130 comprised of amorphous mask layer no with the top horizontal surface covered with the first metal shell layer 112 and with vertical sidewalls of the first opening 122 covered with a thin second metal shell layer 126. The amorphous mask layer no enables formation of thick hard masks with low stress. The thin first metal shell layer 112 and the second metal shell layer 126 provide high selectivity with little additional stress. The steps described for forming the metal shell hard mask 130 are for illustrative purposes and are not limiting. Those skilled in the art can use different but similar processes to fabricate embodiment metal shell hard masks 130.

Figure 1J:
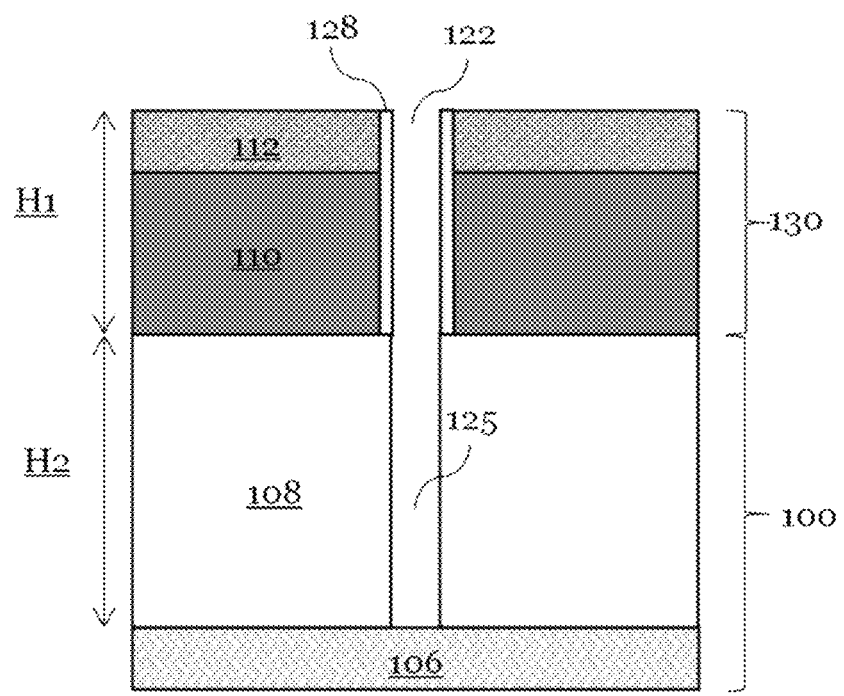

In block 117 and FIG. 1J, by extending the first opening 122, the metal shell hard mask 130 is used as an etch mask to etch a high aspect ratio second opening 125 through the dielectric layer 108 stopping on the semiconductor substrate 106. High aspect ratio openings can be rectangular, square, circular (as in contacts) or any other regular or irregular shape and may be formed like a trench or hole in various embodiments.

Advantageously, because the etch process removes less of the metal shell hard mask 130, specifically, the first metal shell layer 112, the thickness of the amorphous mask layer no does not need to be increased to compensate for mask erosion during etch. Without the first metal shell layer 112, the thickness of the amorphous mask layer no has to be increased as the depth of the high aspect ratio opening is increased so as to be not removed before the second opening 125 is fully formed. In addition, the second metal shell layer 126 on the sidewalls of the mask prevents lateral erosion during long etching times which can result in bowing of the sidewalls in the high aspect ratio openings being etched. With amorphous material hard masks, depth of the high aspect ratio features being etched is limited by vertical and horizontal erosion of the amorphous hard mask material during the etch. With metal shell hard masks, the depth of the high aspect ratio features being etched is not limited by the mask. For example, high aspect ratio features may be etched deeper and with greater fidelity with a metal shell hard mask than with an amorphous material hard mask. In one or more embodiments, the second thickness H2 of the second opening 125 may be 2 to 100 times the first thickness H1 of the metal shell hard mask 130.

Figure 1K:
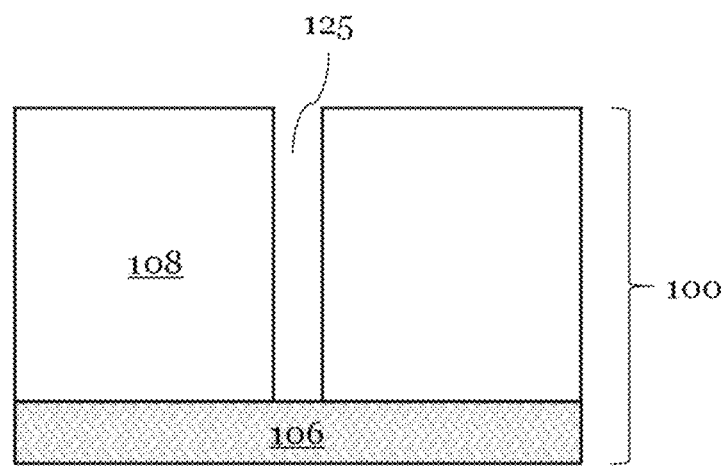

In block 119 and FIG. 1K, the metal shell hard mask 130 is removed from the substrate 100. This completes the formation of high aspect ratio trenches or holes in a semiconductor device in accordance with embodiments.

Figure 2A:
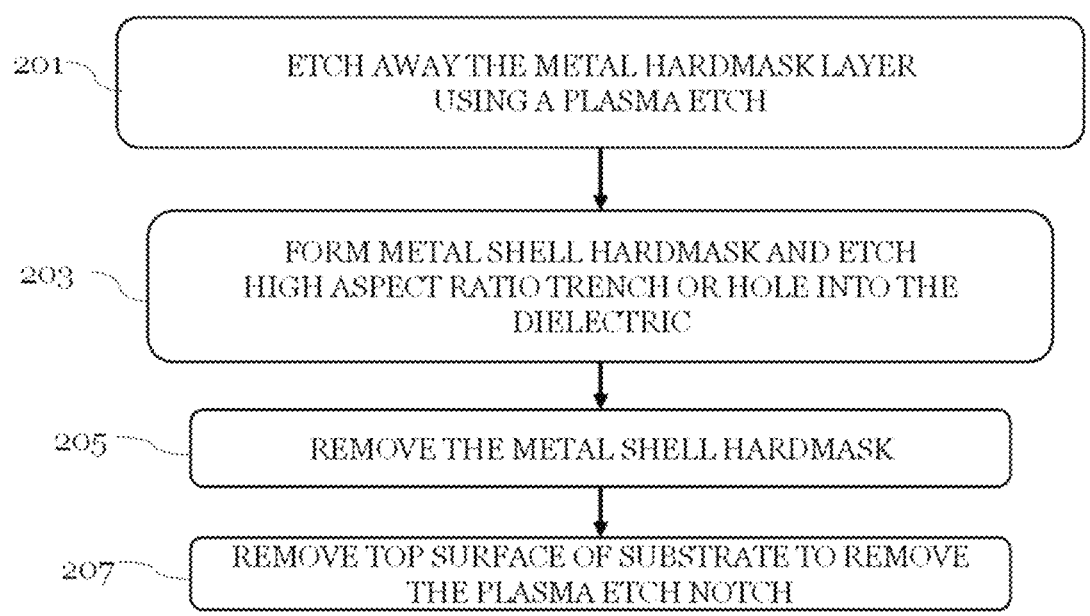
FIG. 2A is a flow diagram describing the formation of a metal shell hard mask and fabrication of a semiconductor device in accordance with embodiments.
Figure 2B:
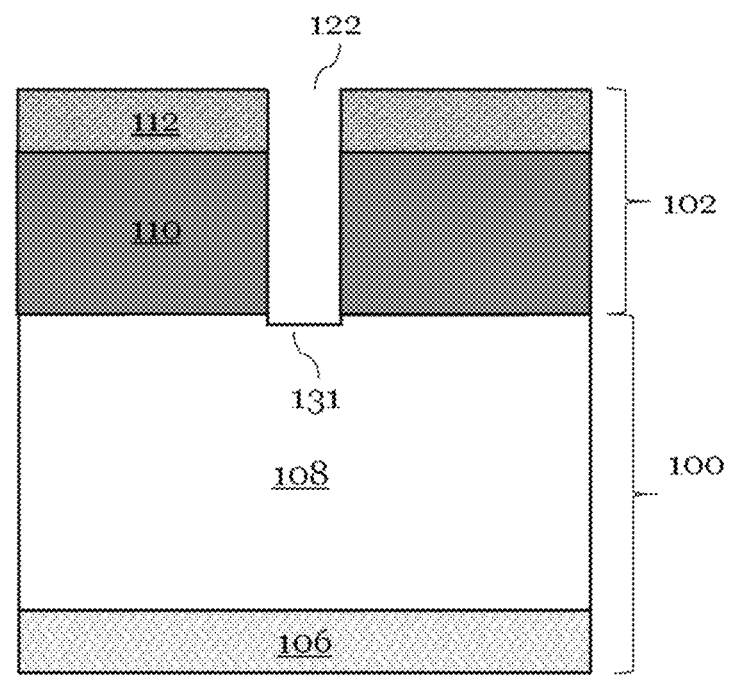
FIGS. 2B-2E are cross sectional views of a semiconductor device during various stages of fabrication and depicting steps in the flow diagram of FIG. 2A.
Figure 2C:
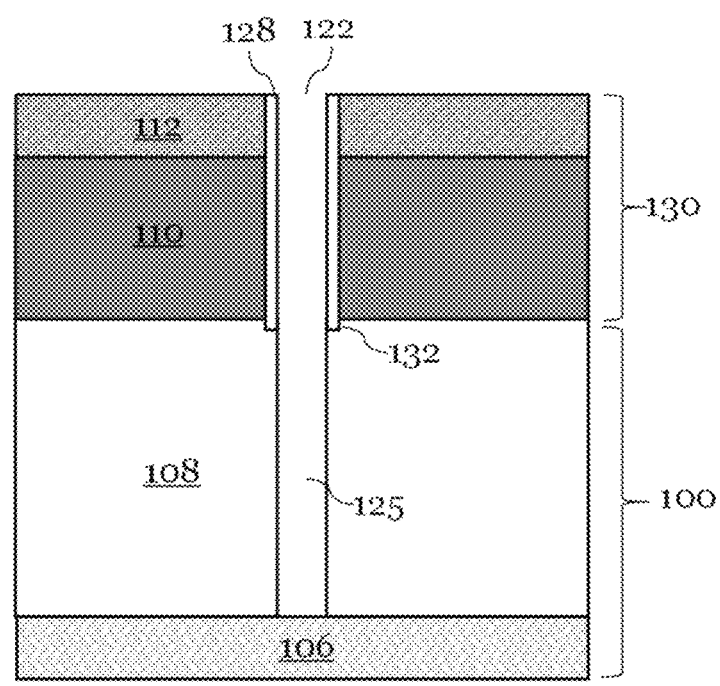
Figure 2D:
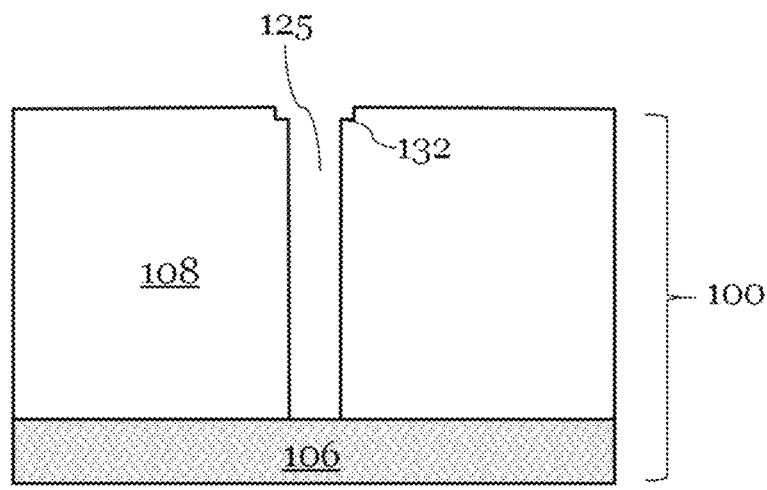

FIG. 2A is a flow diagram describing the formation of a metal shell hard mask using a plasma etch to remove the metal etch hard mask layer 114 in accordance with embodiments. FIGS. 2B-2D are cross sectional views further describing some of the major steps in the flow diagram in FIG. 2A.

This embodiment follows the prior embodiment described in FIGS. 1A-1F. Subsequently, in block 201 of FIG. 2A and the cross-sectional view in FIG. 2B, the metal etch hard mask layer 114 is removed using a plasma etch instead of the high selectivity hot phosphoric etch used to remove metal etch hard mask layer 114 in FIG. 1G. As illustrated in FIG. 2B, the first opening 122 ends with the formation of a shallow opening 131 in the substrate 100. Even when the metal etch hard mask layer 114 is SiN and the substrate dielectric layer 108 is $SiO_2$, the plasma etch selectivity of $SiO_2$ to SiN may not be sufficiently high to avoid etching a shallow opening 131 into dielectric layer 108.

Referring to block 203 and FIG. 2C, second metal shell sidewalls 128 are formed on the vertical surfaces of the first opening 122 in the amorphous mask layer no. A high aspect ratio second opening 125 can then be etched through the dielectric layer 108 stopping on the semiconductor substrate 106. Notches 132 at the bottom corners of the shallow opening 131 may become filled with the second metal shell sidewall 128.

In block 205 and FIG. 2D, the metal shell hard mask 130 is removed. This exposes the notch 132 surrounding the top of the high aspect ratio second opening 125.

Figure 2E:
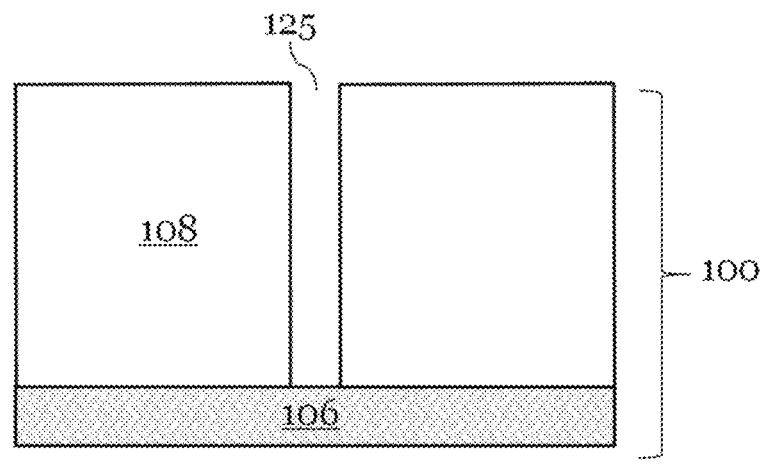

In block 207 and FIG. 2E, the top surface of the substrate dielectric layer 108 is planarized to remove the notch 132. This avoids likely problems due to the notch 132 during subsequent processing. The surface of substrate dielectric layer 108 can be planarized using chemical mechanical polish (CMP) or using an anisotropic plasma etch.

Figure 3A:
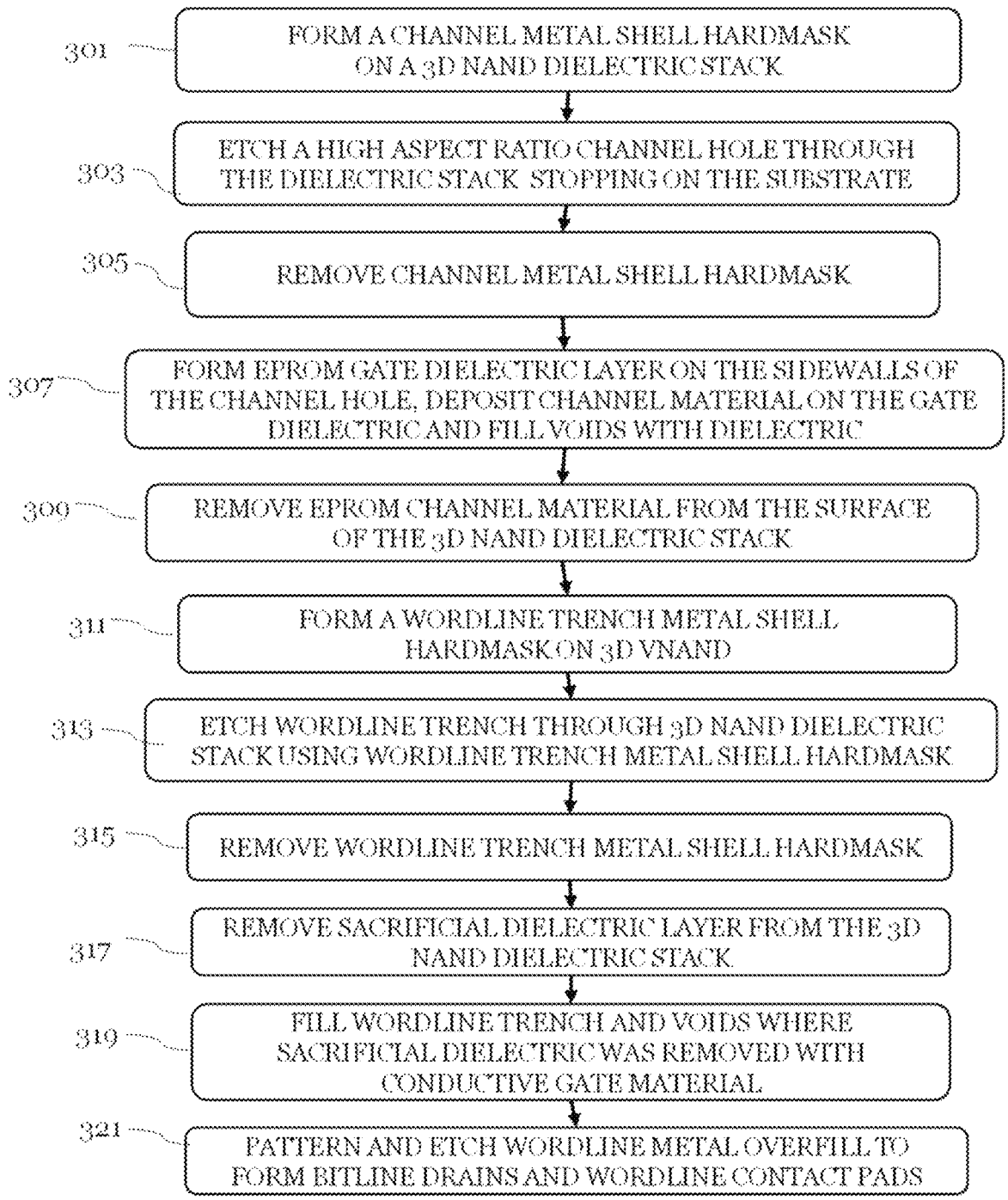
FIG. 3A is a flow diagram describing the formation of high aspect ratio channel holes in a 3D NAND memory array using metal shell hard masks in accordance with embodiments.

A flow diagram in FIG. 3A plus cross-sectional views in FIGS. 3B-3J illustrate a method of fabricating an integrated circuit with a 3D NAND memory array using an embodiment metal shell hard mask.

An EPROM memory array comprises an array of EPROM transistors, where the transistors of the array can be either floating gate or charge trapping flash (CTF) transistors. NAND EPROM memory arrays are typically made using CTF transistor arrays although some flavors of NAND also uses floating gate technology. The gate dielectric of a CTF transistor is, generally, an oxide/nitride/oxide stack. CTF transistors are programmed by trapping electrons in the silicon nitride layer of the stack. In contrast, in a floating gate transistor, programming is performed by tunneling electrons onto an isolated floating gate, where they are stored until being erased.

In 3D NAND memory arrays, multiple CTF transistors stacked one on top of another are fabricated on the vertical sidewalls of high aspect ratio channel holes. The high aspect ratio channel holes are etched into a 3D NAND dielectric stack comprising alternating layers of dielectric and a sacrificial material.

Figure 3B:
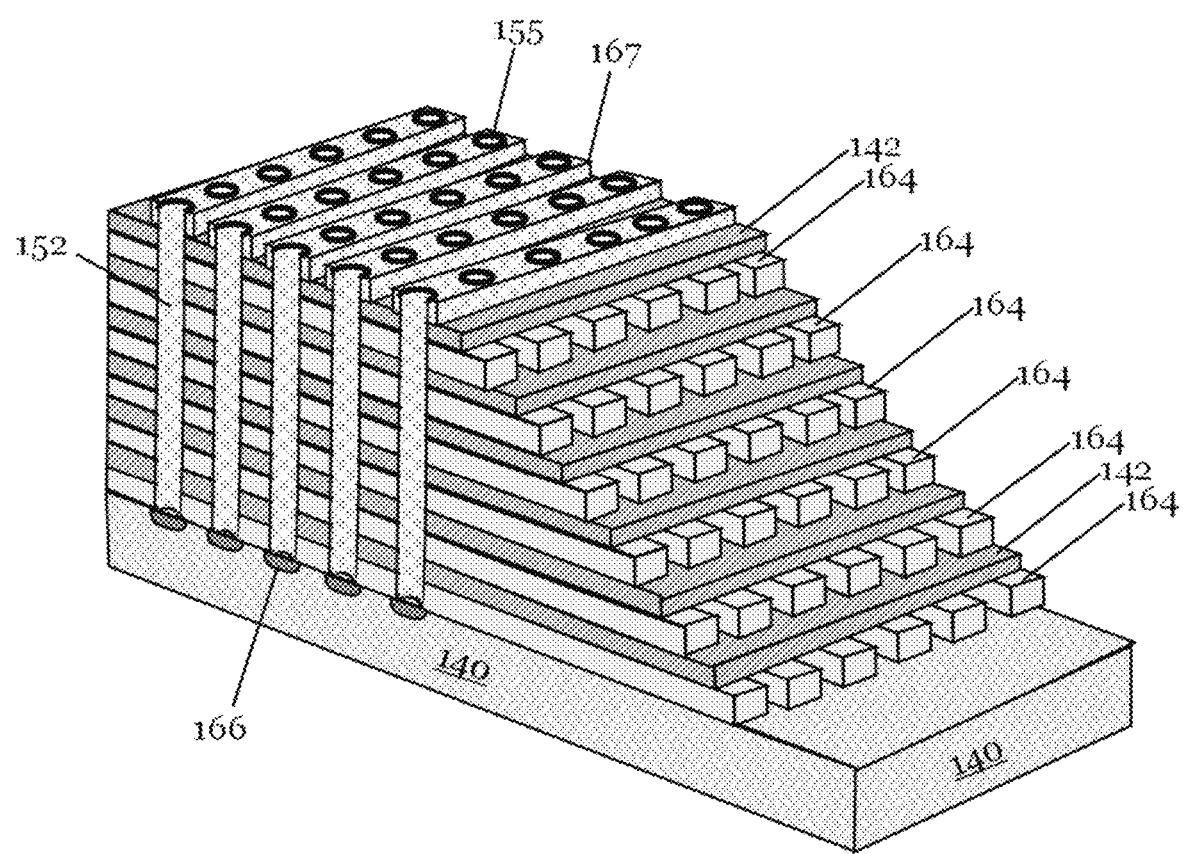
FIG. 3B is a three dimensional isometric projection view of a 3D NAND memory array where some portions are not illustrated.

To clarify the process being described, a partial three-dimensional isometric projection view of a 3D NAND memory array being fabricated is illustrated in FIG. 3B. The 3D NAND memory array being fabricated will be briefly described using FIGS. 3B, 3E, and 3J. Although this embodiment is illustrated using CTF transistors, embodiments may also be applied to 3D NAND technology made with floating gate technology. CTF transistors are formed on the sidewalls of high aspect ratio channel openings 155, which may be holes. A CTF transistor gate dielectric 150 (FIG. 3E) such as oxide/nitride/oxide (ONO) is deposited on the sidewalls of the high aspect ratio channel openings 155. CTF transistor channel material 152 (FIG. 3E) such as polysilicon is deposited on the CTF transistor gate dielectric 150. Each 3D NAND CTF transistor is separated vertically from adjacent CTF transistors by horizontal layers of dielectric 142. Voltage applied to a word line 164 (FIGS. 3B, 3J), which is coupled to the gates of individual transistors, turns the channel of the corresponding CTF transistor ON. The CTF transistor channel material 152 electrically contacts a first bit line 166 (transistor source) in the semiconductor substrate 140 at the bottom of the high aspect ratio channel opening 155 and contacts a second bit line 167 (transistor drain) on the top end of the high aspect ratio channel opening 155. The bit lines 166 and 167 run perpendicular to word lines 164.

The process flow will now be described. A channel metal shell hard mask 146 (FIG. 3C) is used to etch circular high aspect ratio channel holes in which the stacked CTF transistors are fabricated. A word line metal shell hard mask 156 (FIG. 3F) is used to etch rectangular high aspect ratio trenches to electrically separate 3D NAND transistor word lines 164. The channel metal shell hard mask 146 and the word line metal shell hard mask 156 may comprise an amorphous material that is capped with top metal layer and a sidewall metal layer as described in earlier embodiments shown using metal shell hard mask layers 102 comprising amorphous material layer 110/first metal shell layer 112/second metal shell layer 126.

Figure 3C:
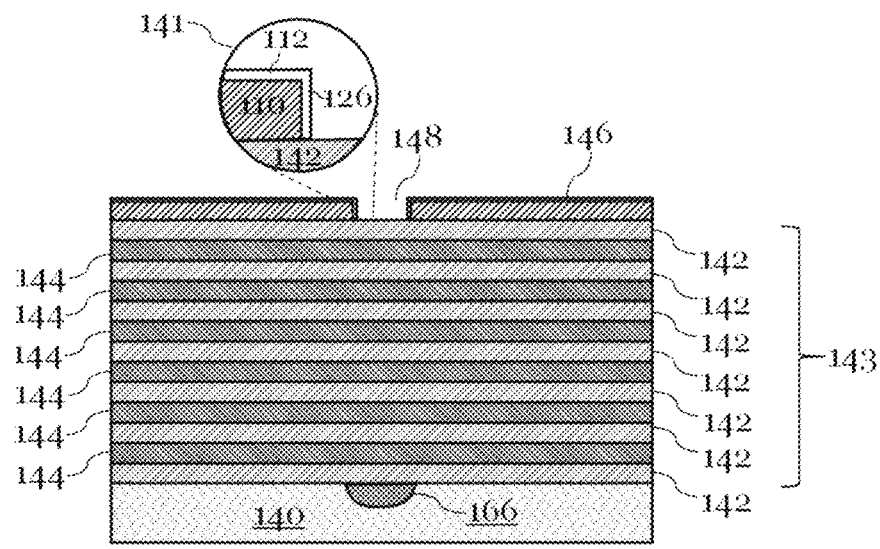
FIGS. 3C-3J are cross sectional views of a 3D NAND memory semiconductor device during various stages of fabrication and depicting steps in the flow diagram of FIG. 3A.

Referring to block 301 in FIG. 3A and the cross-sectional view in FIG. 3C, a channel metal shell hard mask 146 is formed over a 3D NAND dielectric stack 143. As illustrated in inset 141, the channel metal shell hard mask 146 comprises an amorphous mask layer no with a first metal shell layer 112 covering the top horizontal surface, and a second metal shell layer 126 covering the sidewalls of the channel opening 148. The 3D NAND dielectric stack 143 comprises alternating layers of a dielectric 142 such as $SiO_2$ and a sacrificial dielectric layer 144 such as SiN. Later in the process flow, the sacrificial dielectric layer 144 is removed and replaced with conductive gate material 160 such as CVD W (FIG. 3I). A channel opening 148 is formed in the channel metal shell hard mask 146. A bit line 166 diffusion in the semiconductor substrate 140 runs perpendicular to the word lines 164 (FIG. 3B).

The 3D NAND dielectric stack 143 includes alternating layers of dielectric 142 (e.g., silicon dioxide ($SiO_2$)) and sacrificial dielectric layer 144 (e.g., silicon nitride (SiN)), respectively. Although the 3D NAND dielectric stack 143 is shown to include a particular number of layers, the 3D NAND dielectric stack 143 may include as few as two layers and upwards of one-hundred layers or more. The number of layers expected to be a part of the 3D NAND dielectric stack 143 likely will continue to increase over time to provide larger and larger 3D NAND memories.

Figure 3D:
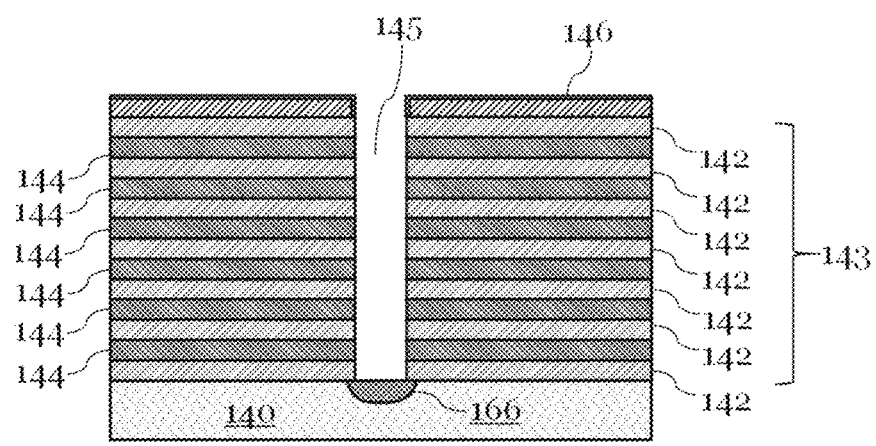

In block 303 and FIG. 3D, using the channel metal shell hard mask layer 146, high aspect ratio channel holes 145 are etched through the 3D NAND dielectric stack 143 stopping on the bit line 166 diffusion in the semiconductor substrate 140. Channel holes 145 are openings in which the channels of the CTF transistors in the 3D NAND memory device are fabricated. Although a single channel hole 145 is shown in the cross-sectional view, one of skill in the art will understand that additional channel holes 145 may be formed.

Figure 3E:
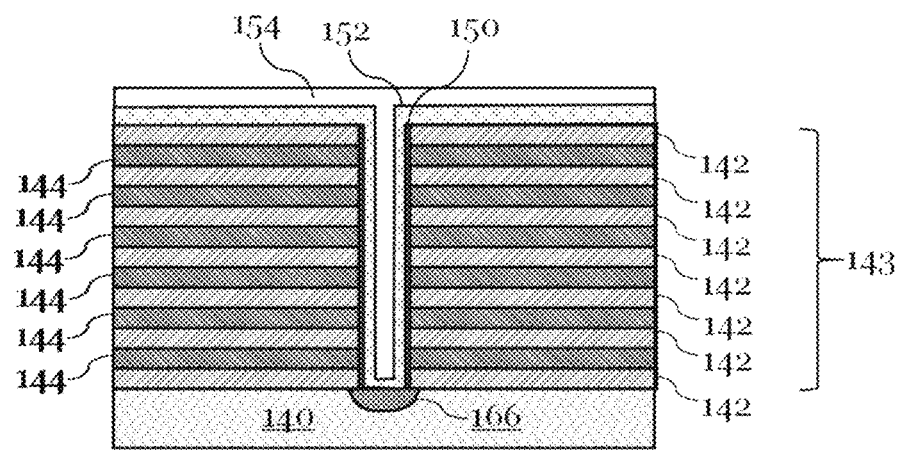

Referring to blocks 305 and 307 in FIG. 3A and the cross-sectional view in FIG. 3E, the channel metal shell hard mask 146 is removed (block 305). Channel holes 145 are filled with channel material for forming the channel of the 3D NAND memory device being formed. The CTF transistor gate dielectric 150 may include an oxide-nitride-oxide (ONO) memory stack and CTF transistor channel material 152 comprising polysilicon. The CTF transistor channel material 152 makes electrical contact with the bit line 166 (transistor source) in the bottom of the high aspect ratio channel hole 145. A dielectric layer 154 such as $SiO_2$ can be deposited on the CTF transistor channel material 152 to fill any remaining voids (block 307).

Figure 3F:
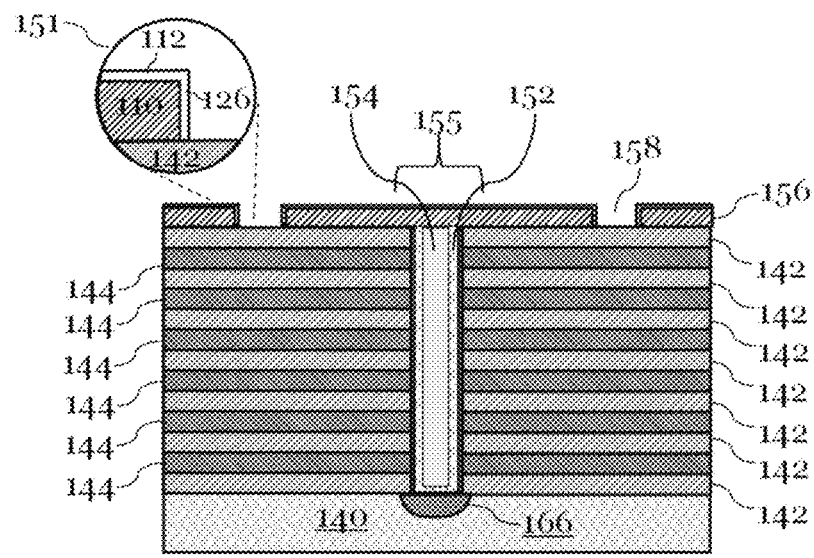

In blocks 309 and 311 and FIG. 3F, the surface is planarized to remove the dielectric layer 154, to remove the CTF transistor channel material 152, and to remove the CTF transistor gate dielectric 150 from the top horizontal surface of the 3D NAND dielectric stack 143 (block 309). A word line metal shell hard mask 156 with word line trench pattern openings 157 is formed on the surface of the 3D NAND dielectric stack 143 (block 311). As illustrated in inset 151, the word line metal shell hard mask 156 comprises an amorphous mask layer no with a first metal shell layer 112 covering the top horizontal surface, and a second metal shell layer 126 covering the sidewalls of the channel opening 148.

Figure 3G:
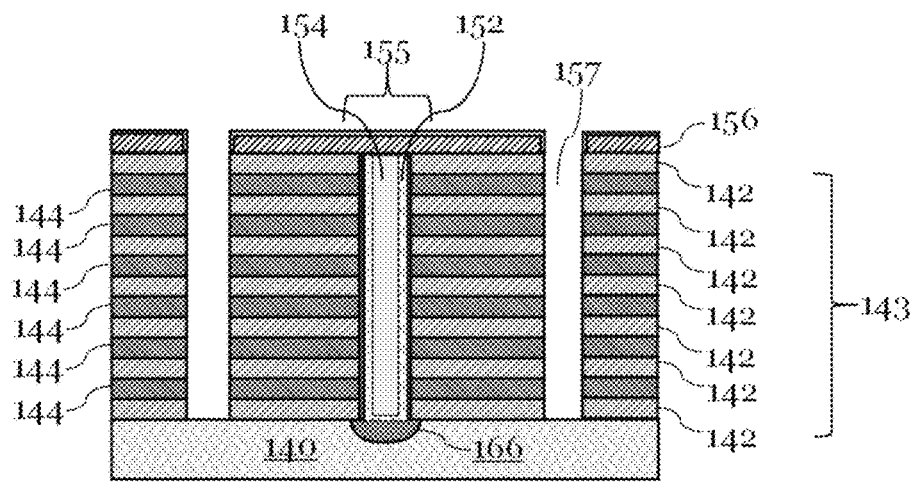

In block 313 and FIG. 3G, the word line metal shell hard mask 156 is used to etch high aspect ratio word line trenches 158 through the 3D NAND dielectric stack 143. The high aspect ratio word line trenches 158 electrically isolate individual word lines 164 (FIG. 3B) from each other.

Figure 3H:
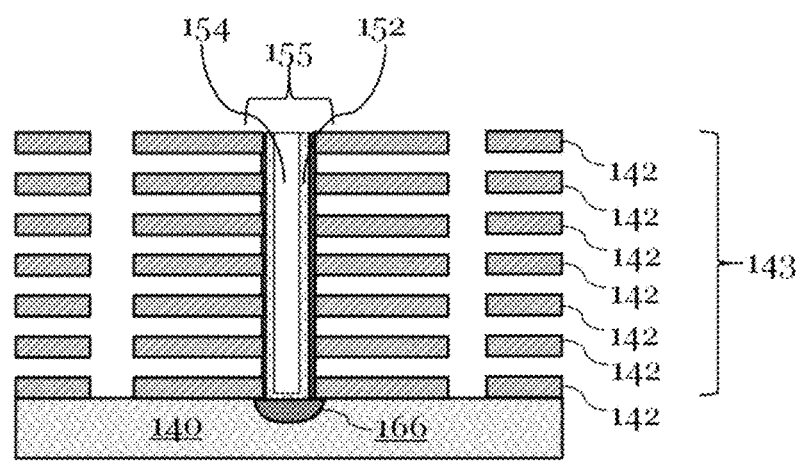
Figure 3I:
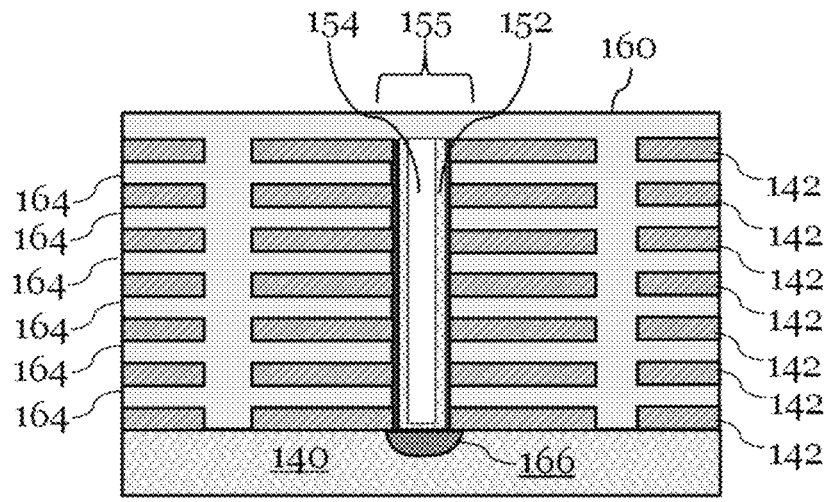

Referring now to blocks 315 and 317 and the cross section in FIG. 3H, the word line metal shell hard mask 156 is removed (block 315). The sacrificial dielectric layers 144 can then be etched away using an isotropic etch. (block 317). In one application where the sacrificial dielectric layers 144 are SiN, they are etched away using hot phosphoric acid.

In block 319 and FIG. 3I, the voided regions where the sacrificial dielectric layers 144 were removed are filled with a conductive gate material 160 (transistor gate material) such as chemical vapor deposited tungsten (CVD-W).

Figure 3J:
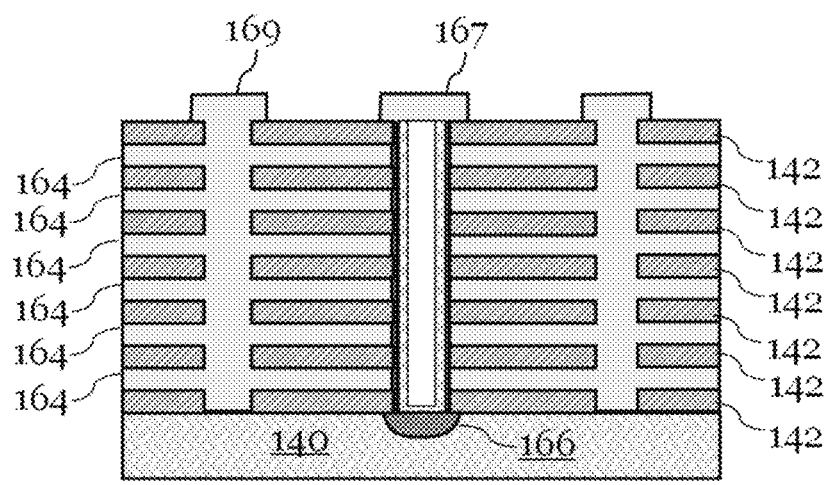

In block 321 and FIG. 3J, the conductive gate material 160 overfill can be patterned and etched to form the NAND transistor stack drain bit line, i.e., second bit line 167, and to form contact pads 169 to the word lines 164 (transistor gates).

Figure 4A:
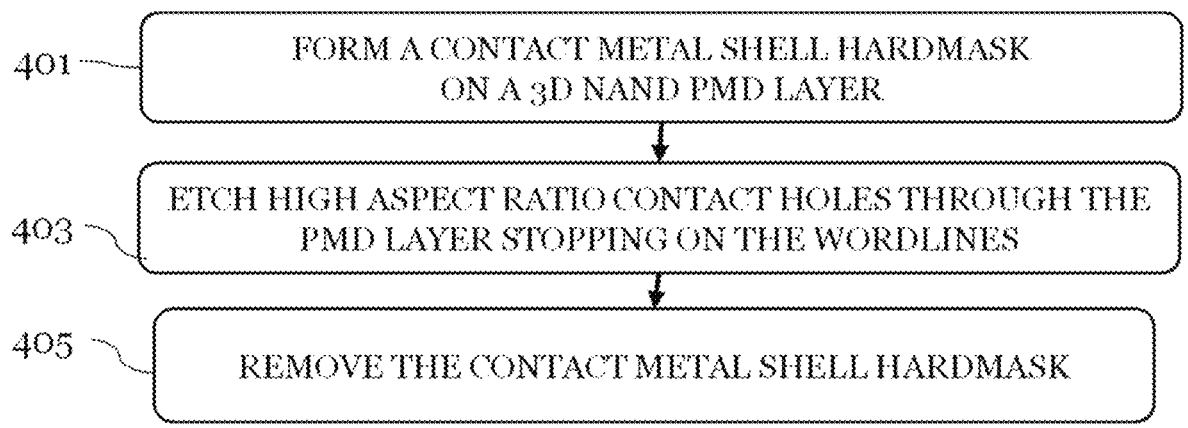
FIG. 4A is a flow diagram describing the formation of high aspect ratio contact holes in a 3D NAND memory semiconductor device.
Figure 4B:
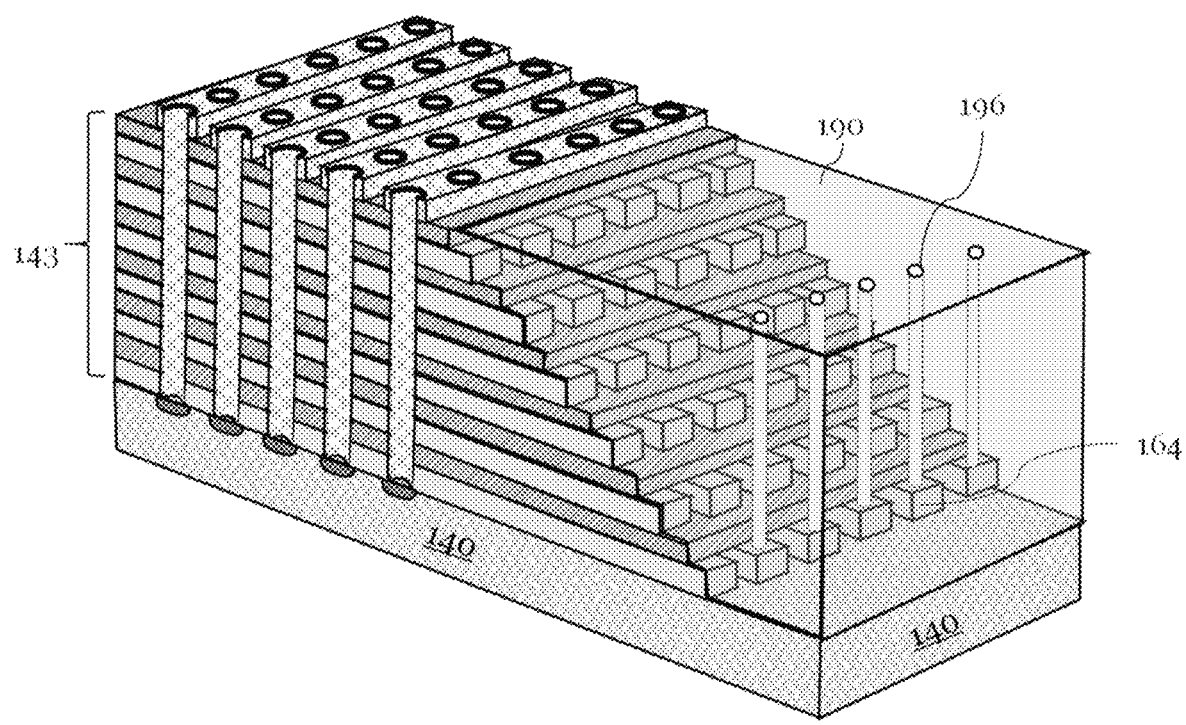
FIG. 4B is a three dimensional isometric projection view of high aspect ratio contact holes in a 3D NAND memory array where some portions are not illustrated.
Figure 4C:
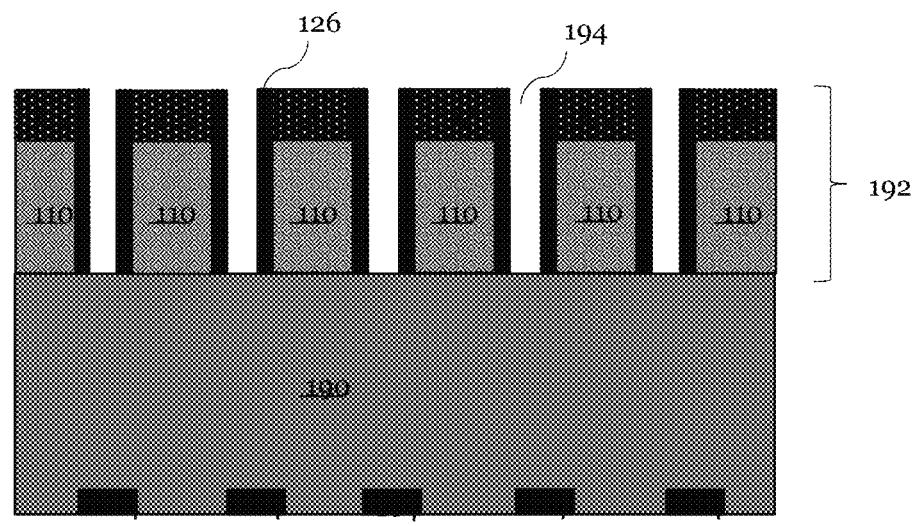
FIGS. 4C-4E are cross sectional views of a 3D NAND memory semiconductor array during various stages of fabrication and depicting steps in the flow diagram of FIG. 4A.
Figure 4D:
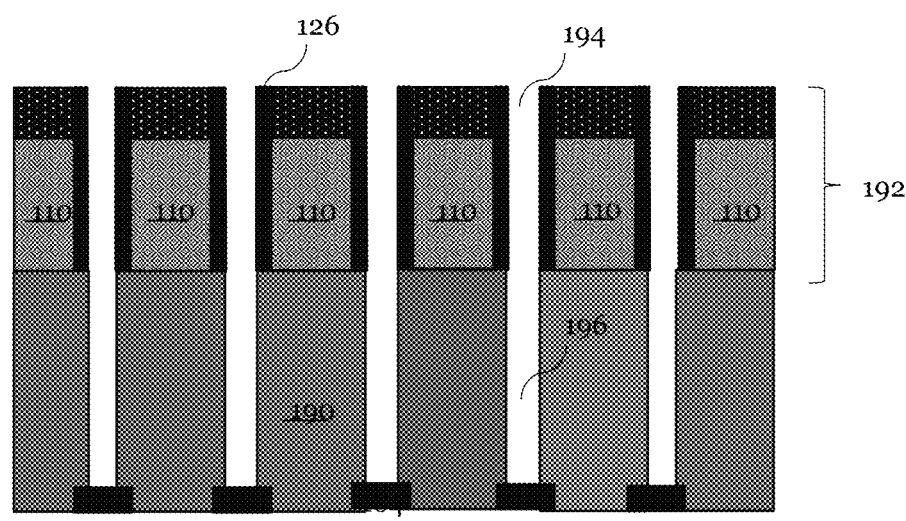
Figure 4E:
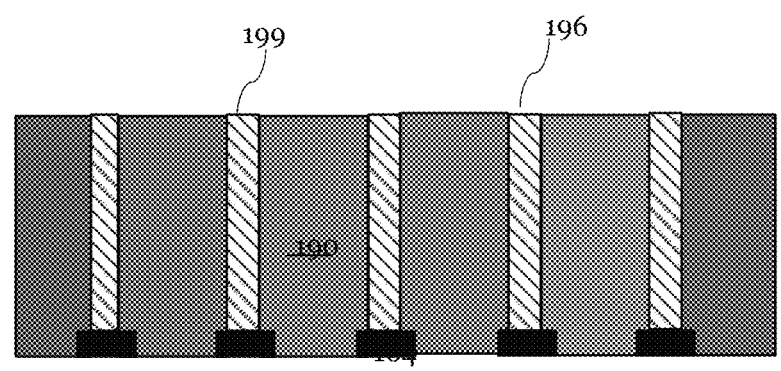

A flow diagram in FIG. 4A plus cross-sectional views in FIGS. 4C-4E illustrate a method of fabricating high aspect ratio contact holes 196 to word lines 164 in the 3D NAND memory array in FIG. 4B using an embodiment metal shell hard mask.

To clarify the process being described, a partial three-dimensional isometric projection view of a 3D NAND memory array being fabricated is illustrated in FIG. 4B. A pre-metal dielectric (PMD) layer 190 is deposited over the stair stepped word lines 164 and is planarized. The PMD layer thickness is approximately the same as the thickness of the 3D NAND dielectric stack 143. High aspect ratio contact holes 196 are etched through the thick PMD layer 190 stopping on the 3D NAND word lines 164. These contact holes 196 can be filled with metal to provide electrical connection between the 3D NAND word lines 164 and overlying metal interconnect leads (not shown).

Referring to block 401 in FIG. 4A and the cross-sectional view in FIG. 4C, a contact metal shell hard mask 192 is formed on the 3D NAND PMD layer 190. The contact metal shell hard mask 192 comprises an amorphous mask layer no with a first metal shell layer 112 covering the top horizontal surface, and a second metal shell layer 126 covering the sidewalls on the opening 194 in the contact metal shell hard mask 192.

In block 403 and the cross-sectional view in FIG. 4D, the contact metal shell hard mask 192 is used to etch high aspect ratio contact holes 196 through the thick PMD layer 190 stopping on the 3D NAND word lines 164.

FIG. 4E (block 405) is a cross-sectional view showing the high aspect ratio contact holes 196 after the contact metal shell hard mask 192 is removed, for example, as described in prior embodiments. The high aspect ratio contact holes 196 may be filled with a contact metal and planarized to form a word line contact plug 199.

Additional processing steps can be performed to form the circuits required to program, read, and write the 3D NAND memory array; to form peripheral logic circuits; and to form overlying metal interconnect layers in the 3D NAND integrated circuit.

Figure 5A:
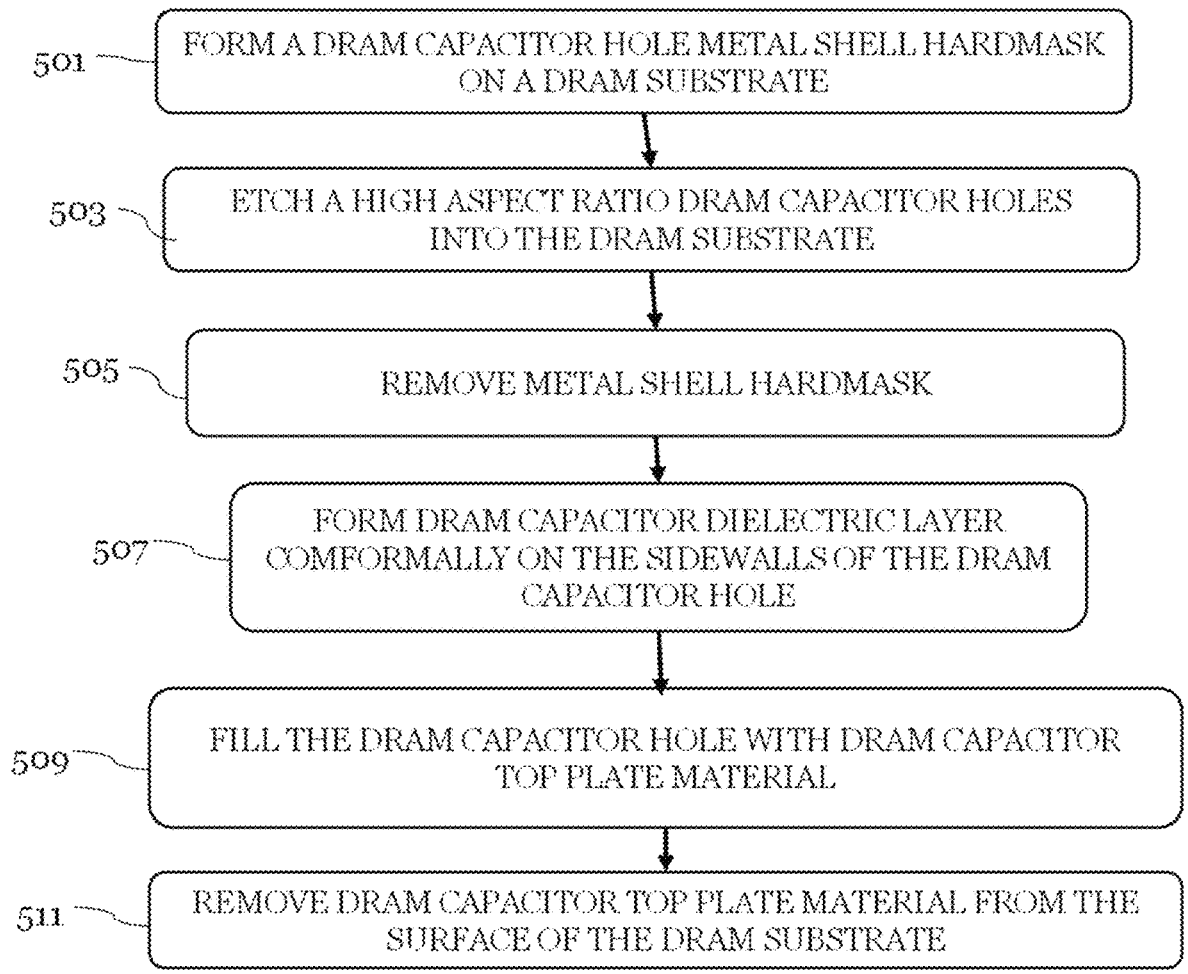
FIG. 5A is a flow diagram describing the formation of high aspect ratio capacitor holes in a DRAM memory array using a metal shell hard mask in accordance with embodiments.

A flow diagram in FIG. 5A along with cross-sectional views in FIGS. 5B-5F illustrate a method of fabricating a trench capacitor DRAM integrated circuit using an embodiment metal shell hard mask. To provide high capacitance for long DRAM memory cell refresh times, DRAM trench capacitors (DRAM capacitors) 172 are fabricated in high aspect ratio openings that are etched deep into the DRAM substrate 170. An embodiment metal shell hard mask can be used to etch the high aspect ratio DRAM capacitor openings 175, e.g., that may be holes.

Figure 5B:
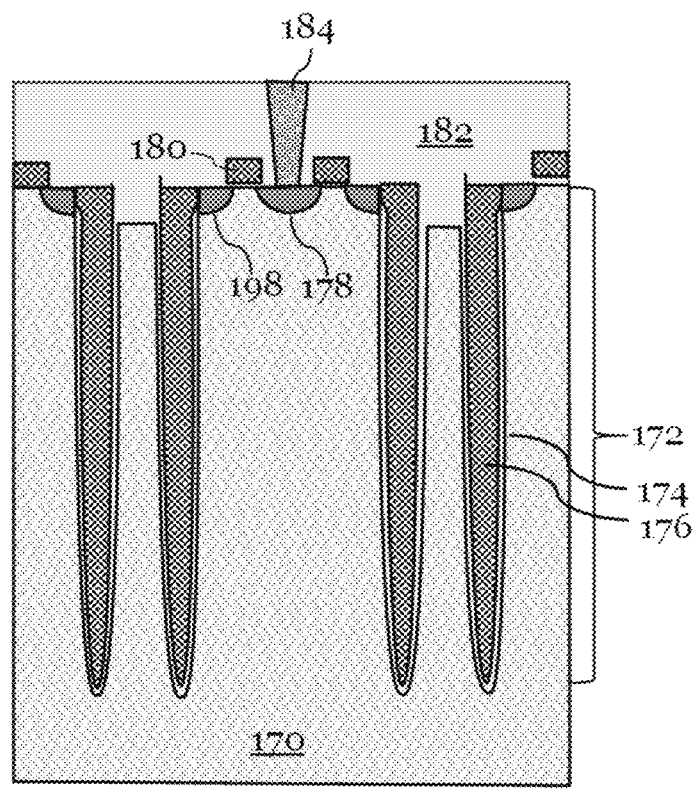
FIGS. 5B-5E are cross sectional views of a DRAM memory semiconductor device during various stages of fabrication and depicting steps in the flow diagram of FIG. 5A.
Figure 5C:
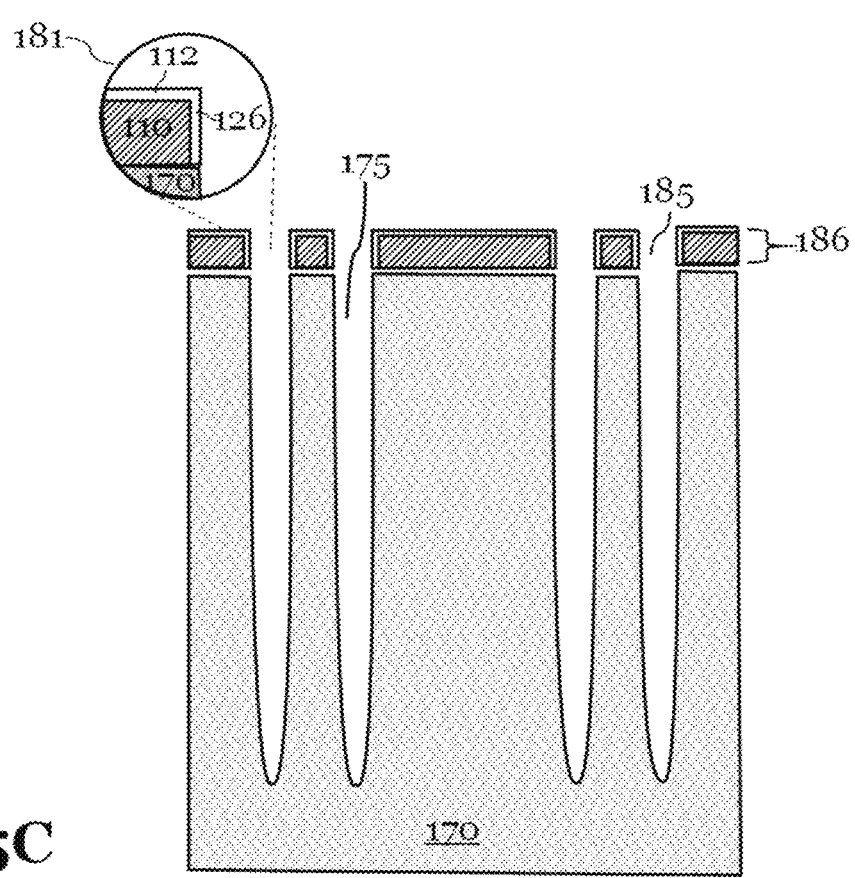

FIG. 5B is a cross sectional view of a section of a 1T1C (one transistor-one capacitor) DRAM memory array. Each DRAM memory cell comprises one DRAM transistor and one DRAM capacitor 172. The DRAM transistor comprises transistor gate 180, source diffusion 198, and drain diffusion 178. The DRAM trench capacitor is fabricated in a high aspect ratio capacitor opening 175 (FIG. 5B). The DRAM capacitor 172 comprises a capacitor bottom plate, a capacitor dielectric, and a capacitor top plate. The DRAM capacitor bottom plate is the DRAM substrate 170, the DRAM capacitor dielectric 174 is a nonconductive material such as a high-k dielectric, and the DRAM capacitor top plate 176 is a conductive plug material such as doped poly filling the DRAM capacitor opening 175 (FIG. 5C). A small amount of the DRAM capacitor dielectric 174 is removed near the top of the DRAM capacitor opening 175 to make electrical contact between the upper portion of the DRAM capacitor top plate 176 and the source diffusion 198 of the DRAM transistor. A contact plug 184 through pre-metal dielectric layer 182 (PMD) forms electrical contact between an overlying interconnect layer (not shown) and the DRAM transistor drain diffusion 178. A voltage can be applied to the contact plug 184 when the DRAM transistor gate 180 is turned ON to charge the DRAM capacitor 172 to a logic state "1". In certain embodiments, the contact plug 184 can be connected to ground to discharge the DRAM capacitor 172 to a logic state "0".

Referring to blocks 501 and 503 in FIG. 5A and the cross section in FIG. 5C, a metal shell hard mask 186 with capacitor hole openings 185 is formed on a DRAM substrate 170 (block 501). The metal shell hard mask 186 may comprise an amorphous material that is capped with top metal layer and a sidewall metal layer as described in inset 181 in FIG. 5C shown using metal shell hard mask layers 102 comprising amorphous material layer no/first metal shell layer 112/second metal shell layer 126.

The DRAM substrate 170 can be a semiconductor substrate such as a single crystal silicon wafer. Using the metal shell hard mask 186, high aspect ratio capacitor openings 175 are etched deep into the DRAM substrate 170 (block 503).

Figure 5D:
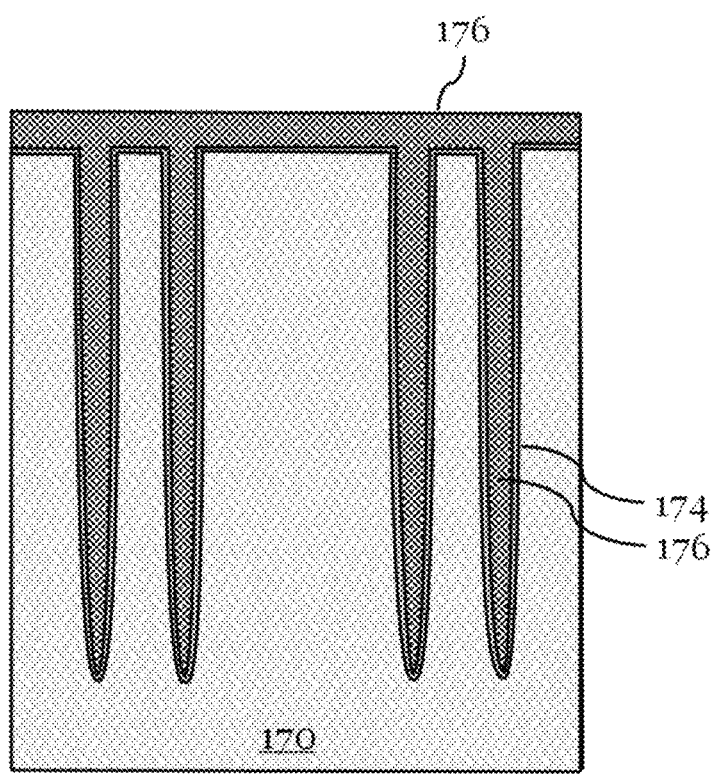

In FIG. 5D, after removing the metal shell hard mask 186 (block 505), a capacitor dielectric can be grown or deposited covering the surfaces of the capacitor openings 175 (block 507). The capacitor dielectric 174 can be a dielectric such as $SiO_2$, SiN, SiON, or a high-k dielectric such as $HfO_2$ or $Al_2O_3$. The capacitor opening 175 can then be filled with a conductive material to form the capacitor top plate 176 (block 509). The capacitor top plate 176 can be a conductive material such as doped poly, tungsten, or a silicide.

Figure 5E:
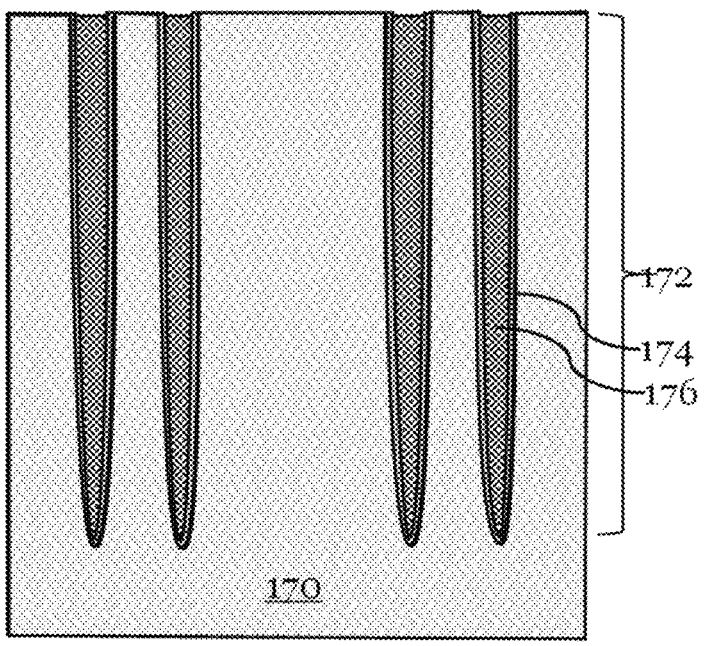

In block 511 and FIG. 5E, the surface is planarized to remove capacitor top plate 176 overfill and to remove the capacitor dielectric 174 from the surface of the DRAM capacitor array and form DRAM capacitors 172 in the DRAM substrate 170.

Additional processing steps can be performed to fabricate the DRAM transistors; to fabricate DRAM memory array read, write, and refresh logic circuits; to fabricate periphery logic circuits; and to fabricate interconnect layers on and above the PMD layer 182 to complete the DRAM integrated circuit.

Example embodiments of the invention are summarized here. Other embodiments can also be understood from the entirety of the specification as well as the claims filed herein.

Example 1

A method for forming a semiconductor device includes forming a first metal layer on top of an amorphous mask layer disposed over a substrate, forming a second metal layer that covers vertical sidewalls of openings in the amorphous mask layer, and etching a pattern in the substrate using the first metal layer and the second metal layer as an etch mask.

Example 2

The method of example 1, where the first metal layer and the second metal layer include a refractory metal.

Example 3

The method of one of examples 1 or 2, where the second metal layer includes tungsten, titanium, tantalum, molybdenum, chromium, hafnium, or ruthenium.

Example 4

The method of one of examples 1 to 3, where the second metal layer includes titanium and tungsten.

Example 5

The method of one of examples 1 to 4, where the first metal layer includes tungsten or tungsten nitride and the second metal layer includes tungsten or tungsten nitride.

Example 6

The method of one of examples 1 to 5, where the first metal layer and the second metal layer are included of the same metal.

Example 7

The method of one of examples 1 to 6, where the amorphous mask layer includes amorphous carbon or amorphous silicon.

Example 8

A method of processing a substrate includes: forming a low stress mask layer over the substrate; forming a first metal layer including a first metal over the low stress mask layer; forming openings in the first metal layer and the low stress mask layer; forming a metal spacer including a second metal on sidewalls of the openings, the first metal layer and the metal spacer defining a metal shell hard mask; and etching a high aspect ratio feature into the substrate using the metal shell hard mask as an etch mask.

Example 9

The method of example 8, where forming the metal spacer includes forming a second metal layer over the first metal layer, and where the first metal layer and the second metal layer are deposited in a same chamber.

Example 10

The method of one of examples 8 or 9, further including: filling the high aspect ratio feature to form a feature of a 3D NAND memory cell.

Example 11

The method of one of examples 8 to 10, further including filling the high aspect ratio feature to form a capacitor plate of a DRAM capacitor of a DRAM memory cell.

Example 12

The method of one of examples 8 to 11, where a depth of the high aspect ratio feature in the substrate is 2 to 100 times a depth of the openings in the first metal layer and the amorphous mask layer.

Example 13

The method of one of examples 8 to 12, where the first and second metals include a refractory metal.

Example 14

The method of one of examples 8 to 13, where the first metal includes tungsten or tungsten nitride and the second metal includes tungsten or tungsten nitride.

Example 15

The method of one of examples 8 to 14, where the first metal and the second metal are different metals.

Example 16

A method of processing a substrate includes: forming a layer stack including a first metal layer and an amorphous mask layer on the substrate; forming an opening through the layer stack; covering sidewalls of the opening with a second metal layer, the first metal layer and the second metal layer defining a metal shell hard mask around the amorphous mask layer; performing an anisotropic etch process to extend the opening into the substrate, the metal shell hard mask being an etch mask during the anisotropic etch process; and removing the metal shell hard mask.

Example 17

The method of example 16, further including forming a 3D NAND memory cell, the forming the 3D NAND memory cell including: forming a 3D NAND substrate by depositing, over the substrate, alternating layers of a dielectric material and a sacrificial material, the layer stack being formed over the alternating layers, where performing an anisotropic etch process includes etching through the alternating layers of the dielectric material and the sacrificial material to extend the opening through the 3D NAND substrate.

Example 18

The method of one of examples 16 or 17, where the dielectric material includes silicon dioxide and where the sacrificial material includes silicon nitride or silicon oxynitride.

Example 19

The method of one of examples 16 to 18, further including filling the opening to form a capacitor plate of a DRAM capacitor of a DRAM memory cell.

Example 20

The method of one of examples 16 to 19, further including filling the opening to form a word line contact plug of a 3D NAND memory cell.

Example 21

The method of one of examples 16 to 20, where the first metal layer and the second metal layer include a refractory metal.

Example 22

The method of one of examples 16 to 21, where the first metal layer and the second metal layer include tungsten or tungsten nitride.

Example 23

The method of one of examples 16 to 22, where the amorphous mask layer is amorphous carbon or amorphous silicon.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for forming a semiconductor device, the method comprising:
    forming a first metal layer on top of an amorphous mask layer disposed over a substrate;
    forming a second metal layer that covers vertical sidewalls of openings in the amorphous mask layer; and
    etching a pattern in the substrate using the first metal layer and the second metal layer as an etch mask.

2. The method of claim 1, wherein the first metal layer and the second metal layer comprise a refractory metal.

3. The method of claim 1, wherein the second metal layer comprises tungsten, titanium, tantalum, molybdenum, chromium, hafnium, or ruthenium.

4. The method of claim 3, wherein the second metal layer comprises titanium and tungsten.

5. The method of claim 1, wherein the first metal layer comprises tungsten or tungsten nitride and the second metal layer comprises tungsten or tungsten nitride.

6. The method of claim 1, wherein the first metal layer and the second metal layer are comprised of the same metal.

7. The method of claim 1, wherein the amorphous mask layer comprises amorphous carbon or amorphous silicon.

8. A method of processing a substrate, the method comprising:
    forming a low stress mask layer over the substrate;
    forming a first metal layer comprising a first metal over the low stress mask layer;
    forming openings in the first metal layer and the low stress mask layer;
    forming a metal spacer comprising a second metal on sidewalls of the openings, the first metal layer and the metal spacer defining a metal shell hard mask; and
    etching a high aspect ratio feature into the substrate using the metal shell hard mask as an etch mask.

9. The method of claim 8, wherein forming the metal spacer comprises forming a second metal layer over the first metal layer, and wherein the first metal layer and the second metal layer are deposited in a same chamber.

10. The method of claim 8, further comprising:
    filling the high aspect ratio feature to form a feature of a 3D NAND memory cell.

11. The method of claim 8, further comprising filling the high aspect ratio feature to form a capacitor plate of a DRAM capacitor of a DRAM memory cell.

12. The method of claim 8, wherein a depth of the high aspect ratio feature in the substrate is 2 to 100 times a depth of the openings in the first metal layer and the low stress mask layer.

13. The method of claim 8, wherein the first and second metals comprise a refractory metal.

14. The method of claim 8, wherein the first metal and the second metal are different metals.

15. A method of processing a substrate, the method comprising:
    forming a layer stack comprising a first metal layer and an amorphous mask layer on the substrate;
    after forming the layer stack, forming an opening through the layer stack;
    covering sidewalls of the opening with a second metal layer, the first metal layer and the second metal layer defining a metal shell hard mask around the amorphous mask layer;
    performing an anisotropic etch process to extend the opening into the substrate, the metal shell hard mask being an etch mask during the anisotropic etch process; and
    removing the metal shell hard mask.

16. The method of claim 15, further comprising forming a 3D NAND memory cell, the forming the 3D NAND memory cell comprising:
    forming a 3D NAND substrate by depositing, over the substrate, alternating layers of a dielectric material and a sacrificial material, the layer stack being formed over the alternating layers, wherein performing the anisotropic etch process comprises etching through the alternating layers of the dielectric material and the sacrificial material to extend the opening through the 3D NAND substrate.

17. The method of claim 16, wherein the dielectric material comprises silicon dioxide and wherein the sacrificial material comprises silicon nitride or silicon oxynitride.

18. The method of claim 15, further comprising filling the opening to form a capacitor plate of a DRAM capacitor of a DRAM memory cell.

19. The method of claim 15, further comprising filling the opening to form a word line contact plug of a 3D NAND memory cell.

20. The method of claim 15, wherein the first metal layer and the second metal layer comprise a refractory metal.

* * * * *